(12) United States Patent
Lesso et al.

(10) Patent No.: US 12,178,134 B2
(45) Date of Patent: Dec. 24, 2024

(54) DRIVER CIRCUITRY

(71) Applicant: Cirrus Logic International Semiconductor Ltd., Edinburgh (GB)

(72) Inventors: John Paul Lesso, Edinburgh (GB); Claire Motion, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 123 days.

(21) Appl. No.: 17/172,564

(22) Filed: Feb. 10, 2021

(65) Prior Publication Data

US 2022/0254980 A1    Aug. 11, 2022

(51) Int. Cl.
*H10N 30/80* (2023.01)
*G01S 7/527* (2006.01)
*G01S 15/931* (2020.01)
*H10N 30/30* (2023.01)

(52) U.S. Cl.
CPC .......... *H10N 30/802* (2023.02); *G01S 7/527* (2013.01); *G01S 15/931* (2013.01); *H10N 30/302* (2023.02); *G01S 2015/932* (2013.01)

(58) Field of Classification Search
CPC .... H01L 41/042; H01L 41/1132; G01S 7/527; G01S 15/931; G01S 2015/932
See application file for complete search history.

(56) References Cited

U.S. PATENT DOCUMENTS

| | | | |
|---|---|---|---|
| 4,227,110 A | 10/1980 | Douglas et al. | |
| 5,113,116 A * | 5/1992 | Wilson | B06B 1/0253 318/116 |
| 6,279,946 B1 * | 8/2001 | Johnson | B60R 21/01526 701/45 |
| 2008/0170515 A1 * | 7/2008 | Masuda | H04M 9/082 370/286 |
| 2011/0290286 A1 * | 12/2011 | Ohata | B06B 1/0207 134/184 |
| 2016/0377714 A1 * | 12/2016 | Masuda | G01S 13/56 342/28 |
| 2018/0253830 A1 * | 9/2018 | Courtney | G06T 5/10 |
| 2019/0028824 A1 * | 1/2019 | Freeman | H04R 29/001 |
| 2019/0294247 A1 * | 9/2019 | Hu | B06B 1/0207 |
| 2020/0403546 A1 | 12/2020 | Janko et al. | |
| 2021/0283738 A1 | 9/2021 | Lu et al. | |

OTHER PUBLICATIONS

Combined Search and Examination Report under Sections 17 and 18(3), UKIPO, Application No. GB2117948.6, mailed Mar. 25, 2022.

* cited by examiner

*Primary Examiner* — Islam A Alsomiri
*Assistant Examiner* — Abdallah Abulaban
(74) *Attorney, Agent, or Firm* — Jackson Walker L.L.P.

(57) ABSTRACT

Circuitry for driving a transducer for an object detection system, the circuitry comprising drive circuitry configured to generate a drive waveform for the transducer, current monitor circuitry for monitoring a current through the transducer, and system identification circuitry. The system identification circuitry is configured to determine a characteristic of the transducer based on a first signal indicative of a drive voltage for the transducer and a second signal indicative of the current through the transducer. The circuitry is operative to adjust the drive waveform based on the determined characteristic of the transducer.

20 Claims, 8 Drawing Sheets

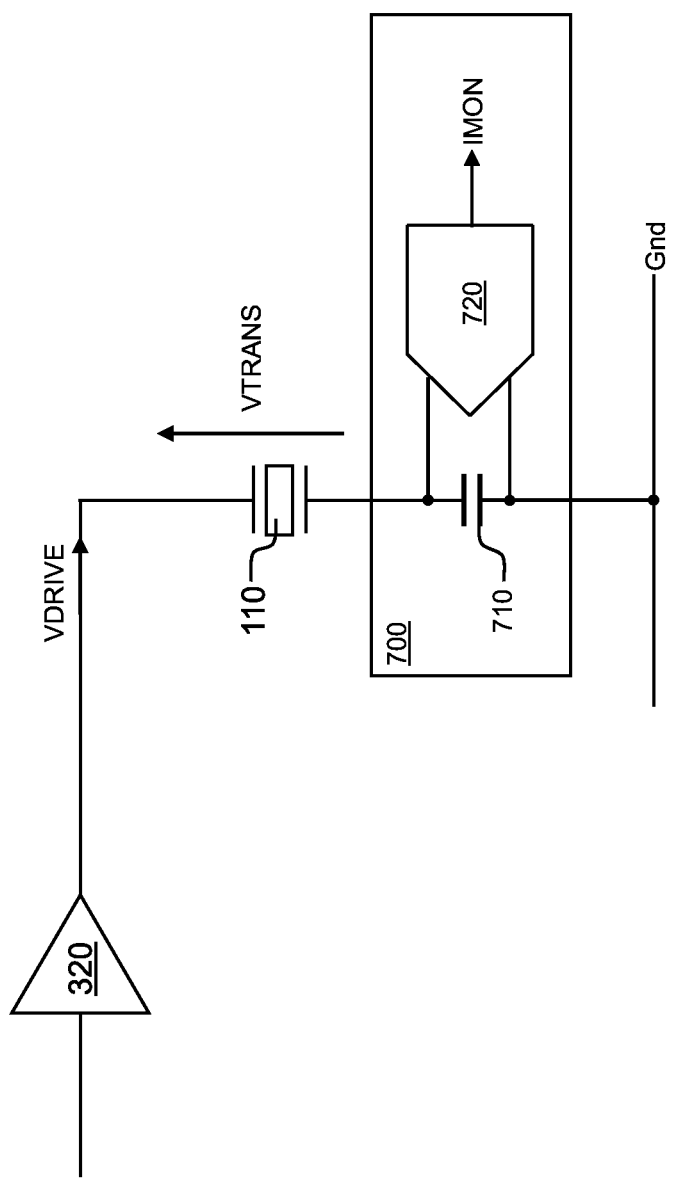

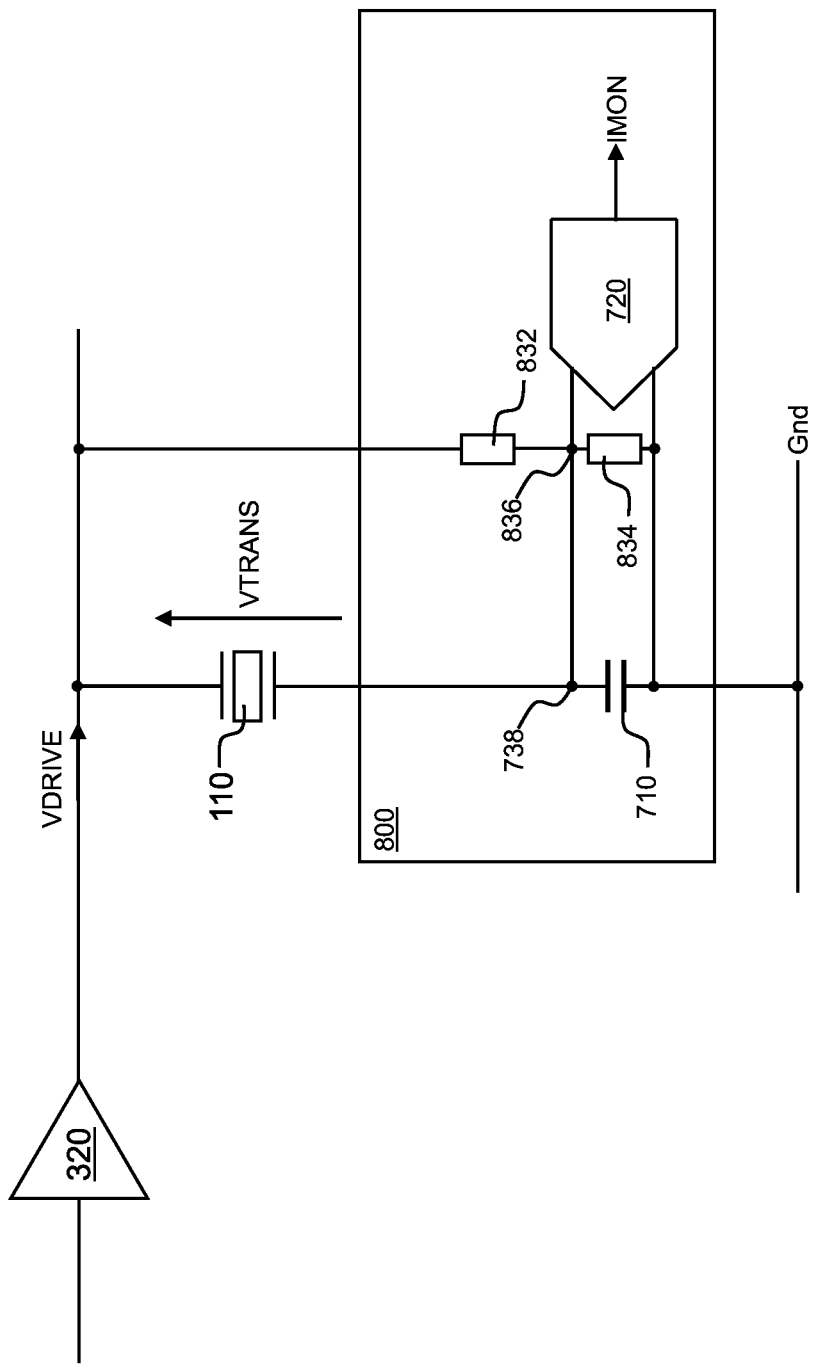

DRIVER CIRCUITRY

FIELD OF THE INVENTION

The present disclosure relates to driver circuitry, and in particular to driver circuitry for piezoelectric transducers.

BACKGROUND

Piezoelectric transducers are increasingly finding application as transducers for sensing and range-finding systems, e.g. in ultrasonic vehicle parking sensor systems.

When driving a piezoelectric transducer, it is desirable to match the frequency of the drive signal to an optimum frequency (e.g. a resonant frequency of the transducer) in a transfer function between input signal frequency and output sound pressure level of the transducer, to maximise the range of the signal transmitted by the transducer. However, due to factors such as aging, temperature and part to part variations or tolerances, the optimum frequency will vary between transducers and over the operational life of any individual transducer, and hence in practice the frequency of the drive signal may rarely match the optimal frequency of the transducer, leading to a sub-optimal transmitted sound pressure level.

A typical approach to addressing this problem is to use a higher drive signal magnitude (e.g. a higher voltage magnitude) than would be required if the drive signal frequency were matched to the optimal frequency of the transducer, to ensure that a desired sound pressure level (and hence range) of the transmitted signal can be achieved. This approach increases the cost of the system, since often a transformer is required to achieve the higher drive signal magnitude, and may also adversely affect the long-term performance of the transducer.

SUMMARY

According to a first aspect, the invention provides circuitry for driving a transducer for an object detection system, the circuitry comprising:
  drive circuitry configured to generate a drive waveform for the transducer;
  current monitor circuitry for monitoring a current through the transducer; and
  system identification circuitry configured to determine a characteristic of the transducer based on a first signal indicative of a drive voltage for the transducer and a second signal indicative of the current through the transducer,
  wherein the circuitry is operative to adjust the drive waveform based on the determined characteristic of the transducer.

The circuitry may further comprise receive filter circuitry tuned to the drive waveform, and wherein the circuitry is operative to adjust a characteristic of the receive filter circuitry based on the determined characteristic of the transducer.

The characteristic may comprise an impedance and/or a transfer function of the transducer.

The system identification circuitry may be configured determine a characteristic of the transducer by performing one or more of:
  a least square algorithm;
  a recursive least squares algorithm;
  a least mean squares algorithm; and
  a steepest descent algorithm.

The system identification circuitry may comprise adaptive filter circuitry.

The receive filter circuitry may comprise matched filter circuitry.

The transducer may comprise a piezoelectric transducer.

The transducer may comprise an ultrasonic parking sensor.

The circuitry may be operative to adapt a frequency content of the drive waveform to correspond to a resonant frequency of the transducer.

The characteristic may comprise a transfer function of the transducer, and the drive circuitry may comprise signal generator circuitry operative to generate a signal and adaptive filter circuitry operative to filter the signal to generate the drive waveform, and the circuitry may be configured to adapt a transfer function of the adaptive filter circuitry such that the frequency content of the drive waveform corresponds to the transfer function of the transducer.

The circuitry further may comprise receive filter circuitry, and the circuitry may be operative to adapt a transfer function of the receive filter circuitry to correspond to the frequency content of the drive waveform.

The drive circuitry may comprise signal generator circuitry operative to generate a signal and adaptive filter circuitry operative to filter the signal to generate the drive waveform, and the circuitry may be configured to adapt a transfer function of the adaptive filter circuitry to minimise a transient response of the transducer to the drive waveform.

The circuitry may be further configured to provide a braking waveform, and the circuitry may be configured to adjust the braking waveform based on the determined characteristic of the transducer.

The drive circuitry may comprise signal generator circuitry operative to generate a signal and adaptive filter circuitry operative to filter the signal to generate the drive waveform, and the circuitry may be configured to adapt a transfer function of the adaptive filter so as to apply an inverse of the transfer function of the transducer to the signal to generate the drive waveform.

The circuitry may further comprise control circuitry configured to detect damage to the transducer based on the determined impedance of the transducer.

The control circuitry may be configured to compare the determined impedance of the transducer to a predefined impedance value and to output a signal indicative of detection of damage if the determined impedance of the transducer differs from the predefined impedance value.

The control circuitry may be configured to output a first signal if a difference between the determined impedance of the transducer and the predefined impedance value is less than a threshold, and to output a second signal if the difference between the determined impedance of the transducer and the predefined impedance value is greater than a threshold.

The current monitor circuitry may comprise a resistor and/or a reactive element.

The reactive element may comprise one or more of a capacitor and an inductor.

The drive waveform may comprise a chirp or a series of chirps or a pulse or a series of pulses.

According to a second aspect, the invention provides an integrated circuit comprising the circuitry of the first aspect.

According to a third aspect, the invention provides a system comprising the circuitry of the first aspect and a transducer.

According to a fourth aspect, the invention provides a vehicle comprising the system of the third aspect.

According to a fifth aspect, the invention provides circuitry comprising:
adaptive drive circuitry for driving a transducer;
adaptive receive filter circuitry;
system identification circuitry operative to determine a transfer function of the transducer and to control the adaptive drive circuitry and the adaptive filter circuitry based on the determined transfer function.

BRIEF DESCRIPTION OF THE DRAWINGS

Embodiments of the invention will now be described, strictly by way of example only, with reference to the accompanying drawings, of which:

FIG. 7 is a schematic representation of alternative current monitor circuitry for the circuitry of FIG. 3; and FIG. 8 is a schematic representation of further alternative current monitor circuitry for the circuitry of FIG. 3.

DETAILED DESCRIPTION

Figure 1:
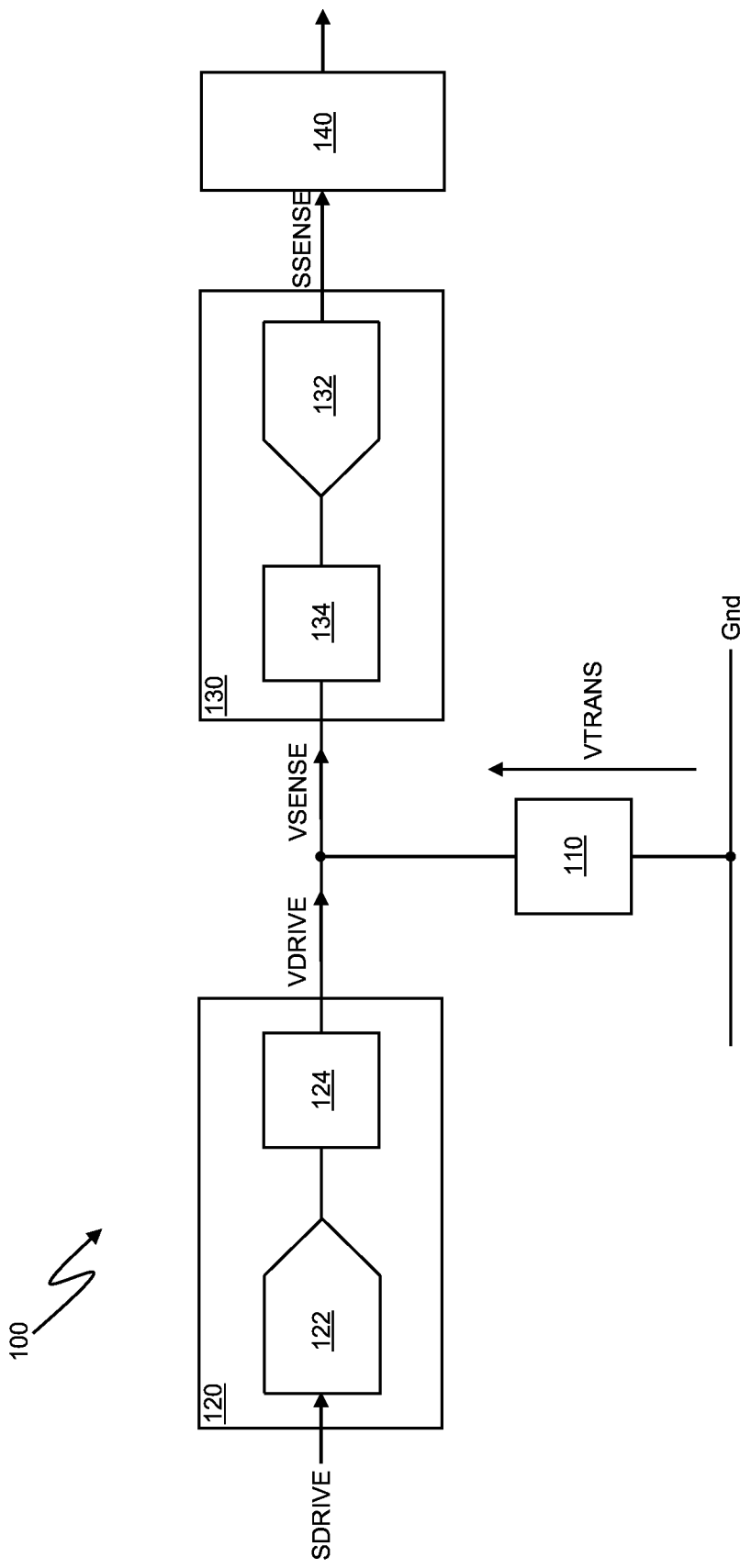
FIG. 1 is a schematic diagram illustrating typical object detection circuitry.

Referring first to FIG. 1, typical circuitry for object sensing or detection (e.g. for use in an ultrasonic vehicle parking sensor system) is shown generally at 100. The circuitry 100 is configured to provide an excitation voltage VDRIVE to a transducer 110, which may be, for example, a piezoelectric transducer, to cause the transducer 110 to generate an object detection signal, which may be, for example, an ultrasonic signal. The circuitry 100 is further configured to sense a voltage VSENSE that develops across the transducer 110 as a result of a reflection or echo of the transmitted object detection signal.

The circuitry 100 includes transmit side circuitry 120, which in the illustrated example includes a digital to analogue converter (DAC) 122 and transmit controller circuitry 124. The DAC 122 is operative to convert a digital drive signal SDRIVE into an analogue excitation voltage VDRIVE suitable for driving the transducer 110, which then generates the object detection signal. The transmit controller circuitry 124 is operative to enable or disable the transmit side circuitry 120, e.g. by selectively coupling the transmit side circuitry 120 to, or decoupling the transmit side circuitry 120 from, the transducer 110.

The circuitry 100 further includes receive side circuitry 130, which in the illustrated example includes an analogue to digital converter (ADC) 132 and receive controller circuitry 134. The ADC 132 is operative to convert an analogue echo detection voltage VSENSE generated by the transducer 110 when it is stimulated by a reflection or echo of the transmitted object detection signal into a digital signal SSENSE for processing by downstream processing circuitry 140. The receive controller circuitry 134 is operative to enable or disable the receive side circuitry 130, e.g. by selectively coupling the receive side circuitry 130 to, or decoupling the receive side circuitry 130 from, the transducer 110.

The downstream processing circuitry 140 is configured to process the digital signal SSENSE to estimate, calculate, or otherwise determine a quantity, value, metric, parameter or the like associated with an object that reflected the transmitted object detection signal, e.g. the distance between the transducer 110 and the object, based on a time interval between transmission of the object detection signal by the transducer 110 and detection of an echo or reflection of the object detection signal, as represented by the digital signal SSENSE.

In operation of the circuitry 100, the transmit side circuitry 120 is enabled by the transmit controller circuitry 124 and the analogue drive voltage VDRIVE based on the digital drive signal SDRIVE is output to the transducer 110, which in turn generates and transmits an object detection signal (e.g. an ultrasonic signal such as a chirp or series of chirps, or a pulse or series of pulses) based on the excitation voltage VDRIVE.

Once the object detection signal has been transmitted by the transducer, the transmit side circuitry 120 is disabled by the transmit controller circuitry 124 and the receive side circuitry 130 is enabled by the receive controller circuitry 134, to enable detection of reflections or echoes of the object detection signal by the receive side circuitry 130. When the transducer 130 is mechanically stimulated by a reflection or echo of the object detection signal, an analogue echo detection voltage VSENSE develops across the transducer 110. This echo detection voltage VSENSE is converted into a digital signal SSENSE by the ADC 132, for downstream processing by the processing circuitry 140, as described above.

Figure 2:
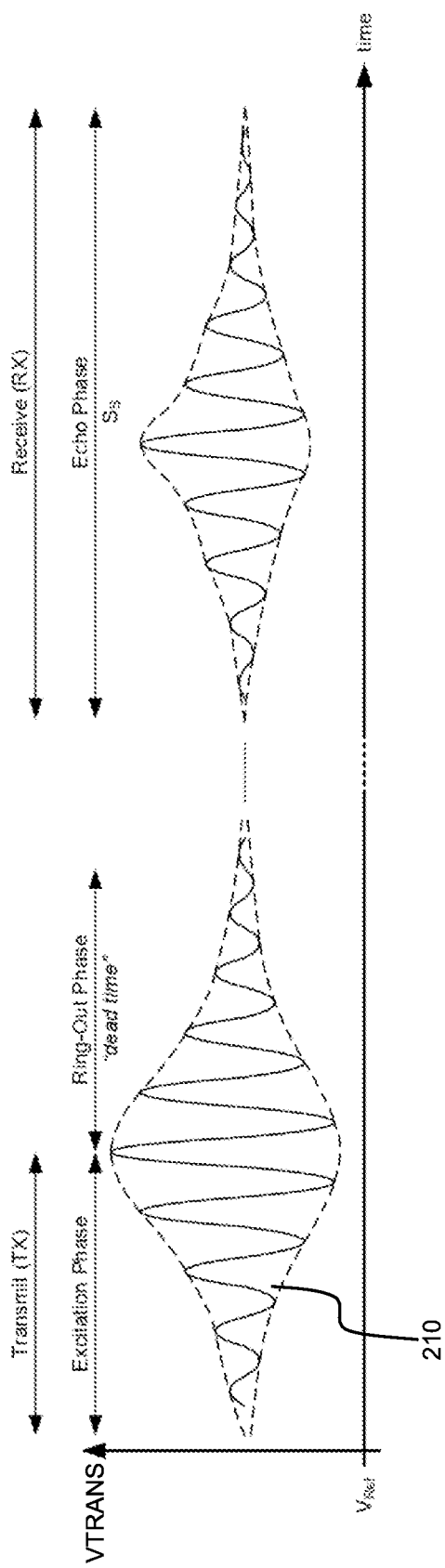
FIG. 2 illustrates the timing of transmission of an object detection signal by a transducer and reception of an echo or reflection signal by the transducer.

FIG. 2 illustrates the timing of the transmission of the object detection signal and reception of an echo or reflection signal by the transducer 110. It is to be noted that the signals shown in FIG. 2 are for illustrative purposes only, and are not necessarily representative of signals that may be present during operation of a practical implementation of the circuitry described above with reference to FIG. 1.

As can be seen in FIG. 2, during an excitation phase of operation of the circuitry 100, in which the transmit side circuitry 120 is enabled to supply the excitation voltage VDRIVE to the transducer 110, the amplitude of a voltage VTRANS across the transducer 110 increases to a peak value. When the transmit side circuitry 120 is disabled, which may be after a single cycle of the excitation voltage at peak amplitude, as shown in FIG. 2, or after multiple cycles of the excitation voltage at peak amplitude, the voltage 210 across the transducer 110 decays over the duration of a ring-out phase of operation of the circuitry 100.

When an echo of the transmitted object detection signal (from an object in the path of the object detection signal) is incident upon the transducer 110 during an echo phase of operation of the circuitry 100, the amplitude of the voltage across the transducer 110 increases as the transducer 110 is mechanically stimulated by the echo. The receive side circuitry 130 is enabled, at a time after the end of the ring-out phase, to commence a receive phase to detect such echoes.

As discussed above, it is desirable to match the frequency content of the drive signal SDRIVE to an optimum frequency (e.g. a resonant frequency of the transducer 110) in the transfer function between input signal frequency and output sound pressure level of the transducer 110, but because of factors such as aging, temperature and part to part variations or tolerances, the optimum frequency will vary between transducers and over the operational life of any individual transducer, and hence in practice the frequency of the drive signal may rarely match the optimal frequency of the transducer.

Thus a need exists for a system that is able to match the frequency content of a drive signal for a transducer to the transfer function of the transducer in order to improve the range of the detection signal that is transmitted by the transducer and the power efficiency of the system.

Figure 3:
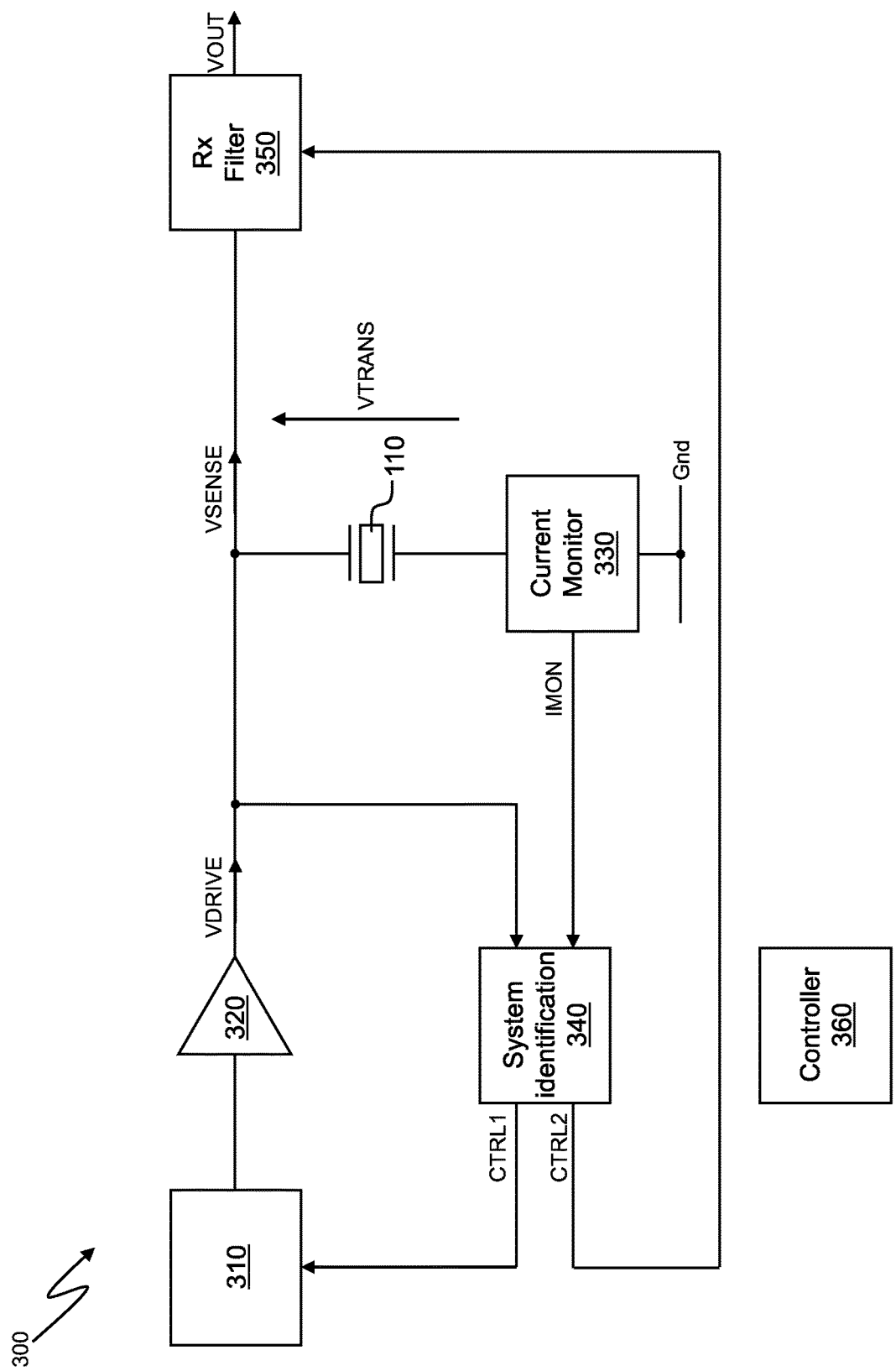
FIG. 3 is a schematic representation of circuitry for driving a transducer.

FIG. 3 is a schematic representation of circuitry for driving a transducer 110 according to the present disclosure. The transducer 110 may be, for example, an ultrasonic transducer for an object detection system. For example, the transducer 110 may be an ultrasonic parking sensor for a parking sensor system.

The circuitry, shown generally at 300 in FIG. 3, comprises drive signal generator circuitry 310, driver circuitry 320, current monitor circuitry 330, and system identification circuitry 340. The circuitry 300 may also comprise receive filter circuitry 350, and may further comprise control circuitry 360.

The drive signal generator circuitry 310 is configured to generate a drive waveform for the transducer 110. The drive waveform may be, for example, a pulse or series of pulses, or a chirp or series of chirps.

An output of the drive signal generator circuitry 310 is coupled to an input of the driver circuitry 320. The driver circuitry 320 may comprise, for example, amplifier circuitry, and is configured to output an excitation voltage VDRIVE, based on the drive waveform provided by the drive signal generator circuitry 310, to cause the transducer 110 to generate an object detection signal, which may be, for example, an ultrasonic signal.

The current monitor circuitry 330 is coupled in series between the transducer 110 and a ground (or other reference voltage) supply rail of the circuitry 300, and is operative to provide an output signal IMON that is indicative of a current through the transducer 330. The current monitor circuitry 330 permits the current through the transducer 110 to be sensed while the transducer 110 is being driven by the excitation voltage VDRIVE.

The system identification circuitry 340 is configured to receive a first signal indicative of the excitation voltage VDRIVE and a second signal IMON indicative of the current through the transducer 110, and to derive, estimate, calculate or otherwise determine one or more characteristics or parameters of the transducer based 110 on the received first and second signals. The determined characteristics or parameter(s) can be used to optimise the drive waveform, to optimise a transfer function of the receive filter circuitry 350, and for diagnostic purposes, as will be explained in more detail below.

The receive filter circuitry 350 is configured to filter an analogue echo detection voltage VSENSE that is generated by the transducer 110 when it is stimulated by a reflection or echo of the transmitted object detection signal, and to provide a filtered output signal VOUT to downstream processing circuitry (not shown).

The receive filter circuitry 350 is tuned to the drive waveform. For example, a pass band of the receive filter circuitry 350 may be configured to correspond to the frequency or frequency range of the drive waveform.

As will be appreciated, the echo detection voltage VSENSE generated by the transducer 110 may contain signal components and/or noise that are unrelated to a detected reflection or echo of the transmitted object detection signal. Such signal components may have frequencies outside of the frequency or frequency range of the drive waveform and the transmitted object detection signal. By filtering the echo detection voltage VSENSE to attenuate such components, the signal to noise ratio of the components of the echo detection voltage VSENSE that relate to a detected reflection or echo of the transmitted object detection signal can be increased to facilitate the downstream processing of these signals.

The receive filter circuitry 350 may comprise analogue filter circuitry configured to perform filtering operations in the analogue domain, or may alternatively comprise analogue to digital converter (ADC) circuitry configured to convert the echo detection voltage VSENSE into a digital signal and digital filter circuitry configured to perform filtering operations in the digital domain. In this case the output signal VOUT may be a digital signal, or alternatively the receive filter circuitry 350 may comprise digital to analogue converter (DAC) circuitry configured to receive the digital signal output by the digital filter circuitry and to convert it into an analogue output signal.

The receive filter circuitry may 350 may comprise, for example, matched filter circuitry, configured to receive a signal indicative of the drive waveform or the excitation voltage VDRIVE and the analogue echo detection voltage VSENSE (or a signal, e.g. a digital signal, indicative of the analogue echo detection voltage VSENSE) and to correlate the excitation voltage VDRIVE (or a version thereof) with the echo detection voltage VSENSE.

As will be appreciated, because the analogue echo detection voltage VSENSE is generated by physical stimulation of the transducer 110 by a reflection or echo of the object detection signal transmitted by the transducer 110, the analogue echo detection voltage VSENSE can be approximated as an attenuated and delayed version of the excitation voltage with some additive noise. Thus, correlating the excitation voltage VDRIVE (or a version thereof) with the echo detection voltage VSENSE increases the signal to noise ratio of those signal components of the echo detection voltage VSENSE that relate to echoes or reflections of the transmitted object detection signal, which can then be output by the receive filter circuitry 350 for downstream processing.

As indicated above, the system identification circuitry 340 is configured to derive, estimate, calculate or otherwise determine a characteristic or parameter of the transducer 110 based on the received first and second signals. The system identification circuitry 340 may comprise, for example, a microprocessor, a microcontroller, a state machine, an ASIC (application specific integrated circuit) or an FPGA (field programmable gate array), or any other circuitry suitable for performing the processing operations described herein.

The system identification circuitry 340 may be configured to derive, estimate, calculate or otherwise determine an impedance of the transducer 110 based on the received first and second signals. For example, the system identification circuitry 340 may comprise circuitry (e.g. adaptive filter circuitry) configured to perform a least squares, recursive least squares (RLS), least mean squares (LMS), or steepest descent (SD) algorithm to determine the impedance of the transducer 110.

Based on the determined impedance, the transfer function between input signal frequency and output sound pressure level of the transducer 110 can inferred, derived, estimated, calculated or otherwise determined, e.g. by the system identification circuitry 340 or by the signal generator circuitry 310.

Once the transfer function of the transducer 110 has been determined, the transfer function can be used to optimise the drive waveform generated by the drive signal generator circuitry 310.

Thus, the system identification circuitry 340 may be configured to output a control signal CTRL1 to the drive signal generator circuitry 310 to cause the drive signal generator circuitry 310 to adjust or adapt the drive waveform to correspond to the resonant frequency of the transducer 110. The control signal CTRL1 may be indicative of the impedance or the transfer function of the transducer 110, for example.

Optimising the drive waveform may comprise adjusting the frequency content of the drive waveform to correspond to the resonant frequency and/or transfer function of the transducer 110, to maximise the sound pressure level of the detection signal output by the transducer 110, thereby maximising range without increasing the amplitude of the excitation voltage VDRIVE.

Additionally or alternatively, optimising the drive waveform may comprise adapting the drive waveform so as to compensate for distortion introduced by the transducer 110 and associated circuitry, e.g. ADCs, DACs, transducer mounting and porting, etc.

Additionally or alternatively, optimising the drive waveform may comprise adapting the drive waveform so as to minimise a transient response of the transducer 110, e.g. to minimise the amplitude of the voltage across the transducer 110 during the ring-out phase, and to minimise the duration of the ring-out phase.

Figure 4:
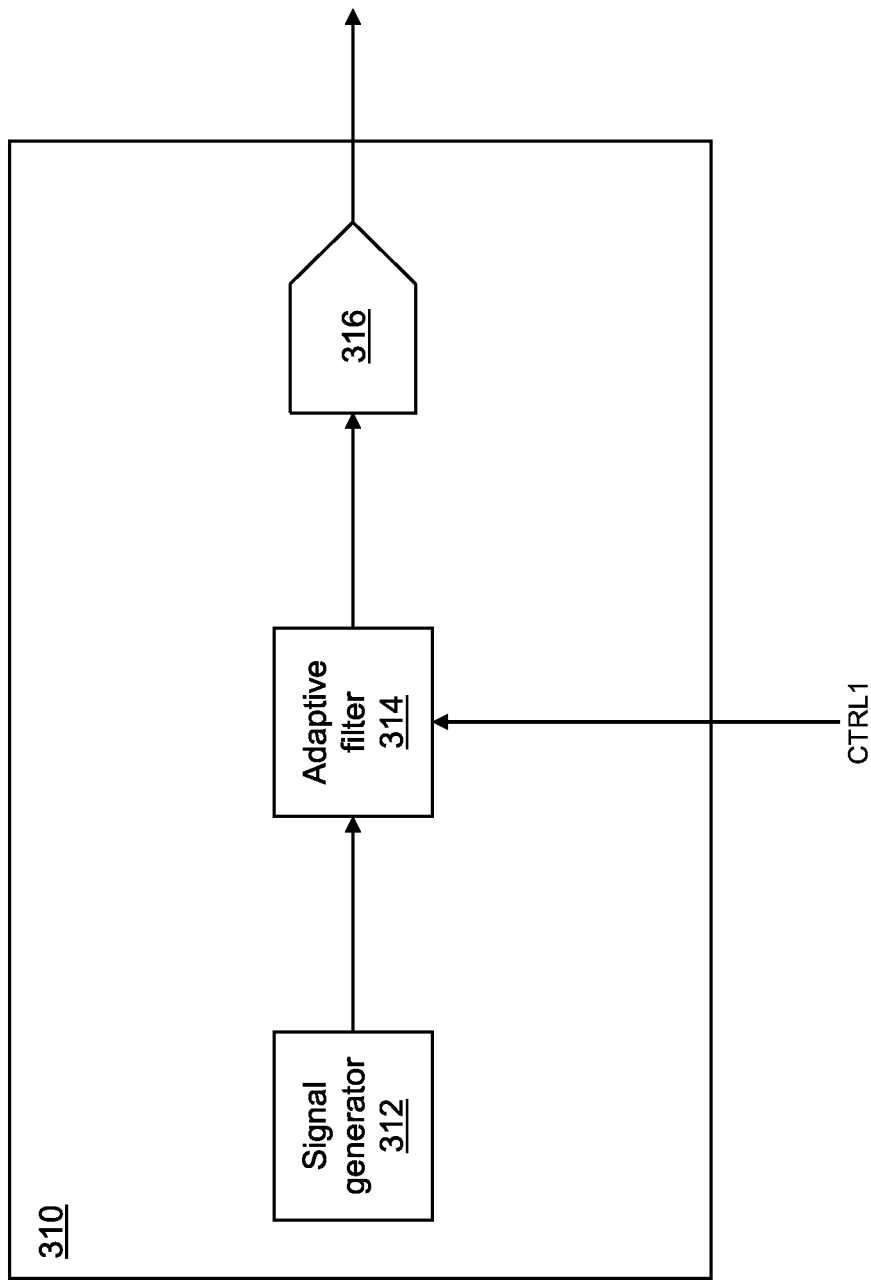
FIG. 4 is a schematic diagram illustrating example circuitry for the drive signal generator circuitry of FIG. 3.

FIG. 4 is a schematic representation of an example architecture for the drive signal generator 310.

As shown in FIG. 4, the drive signal generator circuitry 310 may comprise digital signal generator circuitry 312, adaptive filter circuitry 314 and digital to analogue converter (DAC) circuitry 316.

The digital signal generator circuitry 312 is configured to generate a digital representation of a desired drive waveform such as a pulse or series of pulses or a chirp or series of chirps. The adaptive filter circuitry 314 is configured to receive the control signal CTRL1 from the system identification circuitry 340 and to adapt the transfer function of the adaptive filter circuitry 314 accordingly, such that the frequency content of the filtered digital signal output by the adaptive filter circuitry 314 corresponds to the resonant frequency and/or the transfer function of the transducer 110 (as inferred, derived, estimated, calculated or otherwise determined by the system identification circuitry 340 or by the signal generator circuitry 310). The filtered digital output signal is converted into an analogue signal by the DAC circuitry 316, which outputs the analogue signal to the driver circuitry 320.

Thus the adaptive filter circuitry 314 is configured to shape the drive waveform output by the drive signal generator circuitry 310 to match the resonant frequency of the transducer 110. In this way the amount of power transferred from the drive signal VDRIVE to the transducer 110 can be increased, thus increasing sound pressure level and hence the range of the object detection signal transmitted by the transducer 110.

The adaptive filter circuitry 314 may be further configured to compensate for distortion in the amplitude and/or phase of the object detection signal (compared to the excitation voltage VDRIVE) introduced by the transducer 110, such that the object detection signal transmitted by the transducer 110 is an accurate representation of the excitation voltage VDRIVE.

For example, where the excitation voltage VDRIVE is a chirp or frequency swept pulse, the transfer function between input signal frequency and output sound pressure level of the transducer 110 may not be uniform across the frequency range of the excitation voltage VDRIVE, which may lead to distortion in the amplitude and/or phase of the transmitted object detection signal, compared to the excitation voltage VDRIVE, as certain frequencies in the excitation voltage VDRIVE are subject to greater attenuation than others in the transmitted object detection signal, for example.

The transfer function of the transducer 110 (as determined based on the first and second signals received by the system identification circuitry 340) can be used to compensate for such distortion, e.g. by applying the inverse of the transfer function to the drive signal output by the signal generator circuitry 312. Thus, the adaptive filter circuitry 314 may be configured (e.g. in response to an appropriate control signal from the system identification circuitry 340) to implement the inverse of the transfer function of the transducer 110 to the digital signal output by the signal generator circuitry 312, in order to pre-distort the excitation voltage VDRIVE to compensate for the distortion introduced by the transducer 110. Such pre-distortion may be applied in addition to any shaping of the drive waveform that may be performed by the adaptive filter 314, or as an alternative to such shaping.

The adaptive filter circuitry 314 may be further configured to minimise the transient response of the transducer 110. Once the impedance of the transducer 110 has been determined a drive waveform can be determined that minimises ringing in the transducer 110.

Figure 5:
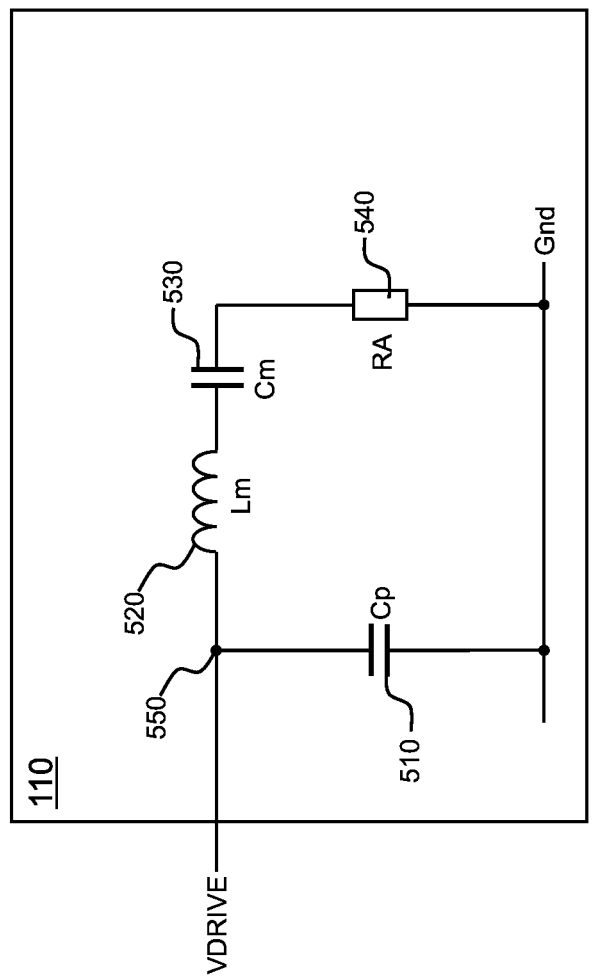
FIG. 5 is a schematic representation of a model of a piezoelectric transducer.

FIG. 5 is a model of a piezoelectric transducer which shows that the transducer 110 can be modelled as a first capacitance 510 of value Cp coupled in parallel with a series combination of an inductance 520 of value Lm, a second capacitance 530 of value Cm and a resistance 540 of value RA. The drive voltage VDRIVE is provided at a node 550 between a first (upper) terminal of the first capacitance 510 and a first terminal of the inductance 520. A second (lower) end of the first capacitance 510 and a lower end of the resistance 540 are coupled to a ground (or other reference voltage) supply rail.

The values Cp, LM, Cm and RA can be calculated based on the determined impedance, and from these a transfer function of the form $$T = e^{-st_D} \, s \, R_A \left( C_P + \frac{C_M}{1 + C_M s (s \, L_M + R_A)} \right),$$

where $t_D$ is a design parameter, can be determined, e.g. by the system identification circuitry 340. The adaptive filter circuitry 314 can then be configured (e.g. in response to an appropriate control signal from the system identification circuitry 340) to implement the transfer function T, or an approximation thereof, such that the excitation voltage VDRIVE maximises power transfer function to the transducer 110 while also minimising ringing.

An alternative approach to reducing or minimising ringing is to add a braking waveform to the drive waveform. A braking waveform is a waveform that is optimised to reduce ringing. Such a waveform is typically optimised for average transducer characteristics, and thus may be less effective in reducing ringing for a given transducer 110 when part-to-part variations in transducer characteristics are taken into account. If the transfer function T of the transducer has been determined as described above, then the braking waveform can be dynamically optimised for the specific characteristics of the transducer 110, thus improving the effectiveness of the braking waveform in reducing ringing for that particular transistor 110.

Thus, the drive signal generator 310 may be operative to adjust or optimise a generic braking waveform for the transducer 110 based on the transfer function T of the transducer 110 that has been determined based on the determined impedance of the transducer 110, and to apply or add the adjusted or optimised braking waveform to the drive waveform such that combined drive and braking waveform is output to the driver circuitry 320.

Where the transfer function of the adaptive filter circuitry 314 is adapted based on the control signal CTRL1 from the system identification circuitry 340 in order to shape the drive waveform output by the drive signal generator circuitry 310 to match the resonant frequency of the transducer 110, or to pre-distort the excitation voltage VDRIVE to compensate for the distortion introduced by the transducer 110, or to minimise ringing as described above, a transfer function of the receive filter circuitry 350 may be correspondingly adapted, e.g. in response to a second control signal CTRL2 output by the system identification circuitry 340, to facilitate detection of signal components of the echo detection voltage VSENSE that arise as a result of echoes or reflections of the transmitted object detection signal. The second control signal CTRL2 may be indicative of the impedance or the transfer function of the transducer 110, for example For example, if the adaptive filter circuitry 314 is adapted to move a centre frequency of the excitation voltage VDRIVE to correspond to the resonant frequency of the transducer 110, the transfer function of the receive filter circuitry 350 may be adapted, in response to a second control signal CTRL2 output by the system identification circuitry, such that a centre frequency of a pass band of the receive filter circuitry 350 corresponds to the centre frequency of the excitation voltage VDRIVE and thus also corresponds to the resonant frequency of the transducer 110. In this way the pass band of the receive filter circuitry 350 corresponds to the expected frequency band of any echoes or reflections of the transmitted object detection signal, and thus any components of the echo detection voltage VSENSE arising from such echoes or reflections pass through the receive filter circuitry 350 without significant attenuation, while other components (e.g. noise) of the echo detection voltage VSENSE will be attenuated.

Where the receive filter circuitry 350 comprises matched filter circuitry, adaptation of the transfer function of the receive filter circuitry 350 as described above may not be necessary, as the receive filter circuitry 350 receives a signal indicative of the drive waveform or the excitation voltage VDRIVE, e.g. during a transmit phase of operation of the circuitry 300 in which the excitation voltage VDRIVE is supplied to the transducer 110, and correlates this (or a version thereof) with the echo detection voltage VSENSE to detect signal components arising from echoes or reflections of the transmitted object detection signal.

The system identification circuitry 340 enables the transfer function of the transducer 110 to be determined during use of the circuitry 300, and the drive signal generator circuitry 310 and receive filter circuitry 350 to be adapted dynamically to optimise or improve the performance (in terms of transmitted object detection signal range and power consumption) of the circuitry 300. Thus the drive circuitry 310 may be regarded as adaptive drive circuitry. Similarly, the receive filter circuitry 350 may be regarded as adaptive receive filter circuitry.

The system identification circuitry 340 also permits calibration of the circuitry 300 to compensate for the effects of ageing and environmental conditions on the performance of the transducer 110. An excitation voltage VDRIVE based on a known drive waveform can be applied to the transducer 110 and the transfer function of the transducer 110 can be determined by the system identification circuitry 340, based on the excitation voltage and the current IMON through the transducer 110, as described above. The drive signal generator circuitry 310 can then be adapted (e.g. by suitable adaptation of the adaptive filter 314) to implement the inverse of the filter transfer function to provide a pre-distortion to the excitation voltage VDRIVE to compensate for changes in the transfer function of the transducer 110 that arise due to ageing and/or environmental conditions.

The impedance of the transducer 110, as determined by the system identification circuitry 340, can be used for diagnostic purposes, e.g. to detect damage to the transducer 110. For example, the impedance of the transducer 110, as determined by the system identification circuitry 340, can be compared, e.g. by control circuitry 360, to one or more predefined impedance values representing a range of normal or expected impedance values for the transducer 110. If the determined impedance of the transducer 110 is outside of the range, the control circuitry 360 may output a signal to an external system (not shown) such as a vehicle management system to alert a user of possible damage to the transducer 110. For example, if the difference between the determined impedance of the transducer 110 and an upper or lower limit of the normal or expected impedance value of the transducer 110 is less than or equal to a threshold, the control circuitry 360 may output a first signal indicative of possible minor damage to the transducer 110, whereas if the difference between the determined impedance of the transducer 110 and the upper or lower limit of the normal or expected impedance value of the transducer 110 is greater than the threshold, the control circuitry 360 may output a second signal indicative of possible more serious damage to the transducer 110.

In the event of a change in the transfer function of the transducer 110 caused by damage to the transducer 110 the circuitry 300 may be able to compensate, at least partially, for the change in the transfer function by adapting the drive waveform as described above.

Figure 6:
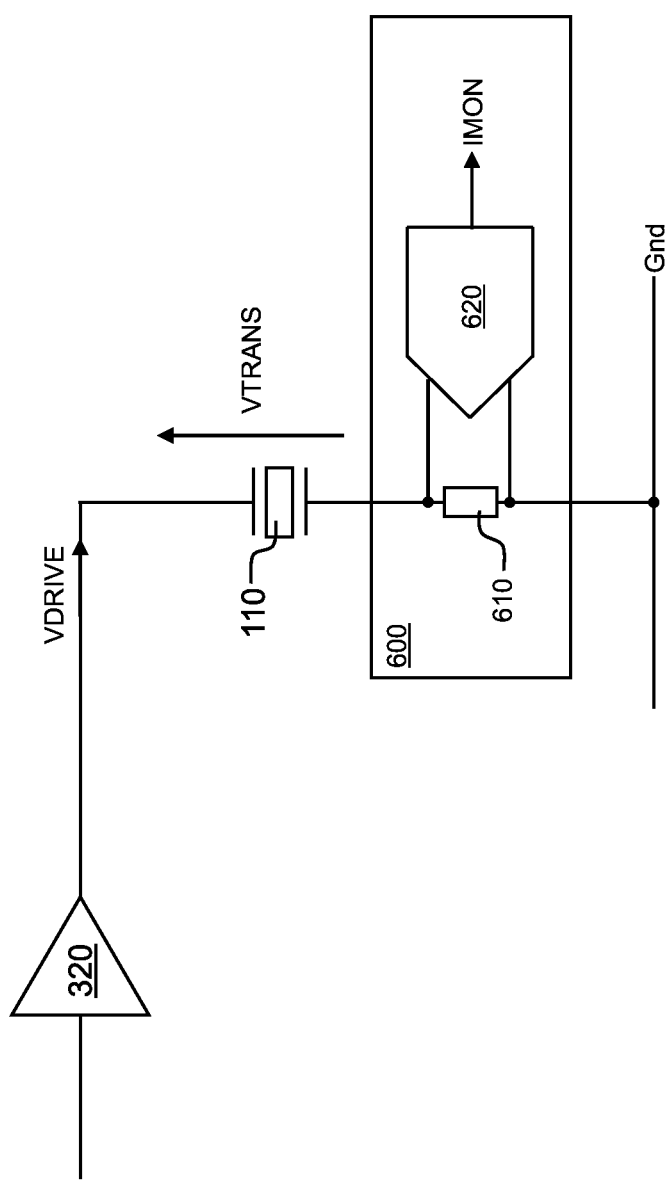
FIG. 6 is a schematic representation of current monitor circuitry for the circuitry of FIG. 3.

Turning now to FIG. 6, example circuitry for use as the current monitoring circuitry 330 is shown generally at 600.

The circuitry 600 includes a sense resistor 610 of known value coupled in series between the transducer 110 and a ground (or other reference voltage) supply rail. To avoid excessive attenuation of the excitation signal VDRIVE the sense resistor 610 should have a small resistance. A voltage drop across the sense resistor 610 is indicative of the instantaneous current through the sense resistor 610 and thus also the current through the transducer 110.

The circuitry 600 further includes a differential analogue to digital converter (ADC) 620 coupled in parallel with the sense resistor 610, such that a first input of the ADC 620 is coupled to a first terminal of the sense resistor 610, and a second input of the ADC 620 is coupled to a second terminal of the sense resistor 610. Thus the ADC 620 generates a digital output signal IMON, which is indicative of the current through the transducer 110.

FIG. 7 illustrates alternative example circuitry for use as the current monitoring circuitry 330.

The circuitry, shown generally at 700 in FIG. 7, includes a sense capacitor 710 coupled in series between the transducer 110 and a ground (or other reference voltage) supply rail. To avoid excessive attenuation of the excitation signal VDRIVE the sense capacitor 710 should have a large capacitance. A differential analogue to digital converter (ADC) 720 is coupled in parallel with the capacitor 710, such that a first input of the ADC 720 is coupled to a first terminal of the capacitor 710, and a second input of the ADC 720 is coupled to a second terminal of the capacitor 710. The ADC 720 generates a digital output signal IMON, which is indicative of the current through the transducer 110.

As will be appreciated, the combination of the capacitance of the transducer 110 and the sense capacitance 710 forms a capacitive voltage divider. FIG. 8 illustrates (at 800) a modified version of the circuitry 700 in which a resistive potential divider comprising first and second resistors 832, 834 is coupled in parallel with the series combination of the transducer 110 and the sense capacitor 710, with a node 836 intermediate the first and second resistors 832, 834 being coupled to a node 838 intermediate the transducer 110 and the sense capacitor 710, to provide a bias voltage.

In alternative examples an inductor may be used in place of the capacitor 710 in the current monitoring circuity 330, or alternatively a combination of an inductor and a capacitor may be used in place of the capacitor 710. Thus the current monitoring circuitry may comprise a resistive element, as shown in FIG. 6, or may comprise reactive element, which may comprise a capacitor, an inductor, or a capacitor and an inductor.

As will be apparent from the foregoing discussion, the circuitry 300 and the techniques described herein permit the drive waveform to be adapted to improve or optimise the sound pressure level of a signal transmitted by the transducer based on the drive waveform. Thus the use of excessive excitation voltage magnitudes can be avoided, which leads to improved power efficiency and possibly also extended transducer lifespan. Further, the drive waveform can be adapted to compensate for environmental and ageing effects on the transfer function of the transducer, and/or to minimise or reduce the transient response of the transducer, thereby minimising or reducing ringing. Additionally, by calculating, estimating, inferring or otherwise determining the impedance of the transducer, damage to the transducer can be detected and appropriate warnings can be provided, e.g. to a driver of a vehicle incorporating the transducer 110 and the circuitry 300 and/or appropriate action can be taken to mitigate the effects of the damage, e.g. by adapting the drive waveform to compensate for the damage to the transducer.

The circuitry 300 may be provided or implemented in integrated circuitry, e.g. as a single integrated circuit comprising the drive signal generator circuitry 310, driver circuitry 320, current monitor circuitry 330, and system identification circuitry 340. The integrated circuit may also include the receive filter circuitry 350, and the control circuitry 360.

The present disclosure extends to a system comprising the circuitry 300 (e.g. implemented as an integrated circuit) and a transducer 110 (e.g. a piezoelectric transducer) and to a vehicle such as a car that incorporates such a system.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device, or a gaming device such as a games console. The device could be a wearable device such as a smartwatch, eyewear (e.g. smart glasses) or the like. The device could be a virtual reality (VR) or augmented reality (AR) device such as a VR or AR headset. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for driving a transducer for an object detection system, the circuitry comprising:
   drive circuitry configured to generate a drive waveform for the transducer;
   current monitor circuitry for monitoring a current through the transducer; and
   system identification circuitry configured to determine an impedance of the transducer based on a first signal indicative of a drive voltage for the transducer and a second signal indicative of the current through the transducer,
   wherein the circuitry is operative to adjust the drive waveform based on the determined impedance of the transducer,
   wherein the circuitry further comprises receive filter circuitry tuned to the drive waveform,
   wherein the circuitry is configured to determine, based on the determined impedance of the transducer, a transfer function between a frequency of the drive waveform and an output sound pressure level of the transducer,
   wherein the circuitry is operative to adjust a transfer function of the receive filter circuitry based on the determined impedance of the transducer, and
   wherein the drive circuitry comprises signal generator circuitry operative to generate a signal and adaptive filter circuitry operative to filter the signal to generate the drive waveform, wherein the circuitry is configured to adapt a transfer function of the adaptive filter so as to apply an inverse of the determined transfer function of the transducer to the signal to generate the drive waveform.

2. Circuitry according to claim 1, wherein the system identification circuitry is configured to determine a characteristic of the transducer by performing one or more of:
   a least square algorithm;
   a recursive least squares algorithm;
   a least mean squares algorithm; and
   a steepest descent algorithm.

3. Circuitry according to claim 1, wherein the receive filter circuitry comprises matched filter circuitry.

4. Circuitry according to claim 1, wherein the transducer comprises a piezoelectric transducer.

5. Circuitry according to claim 4, wherein the transducer comprises an ultrasonic parking sensor.

6. Circuitry according to claim 1, wherein the circuitry is operative to adapt a frequency content of the drive waveform to correspond to a resonant frequency of the transducer.

7. Circuitry according to claim 6, wherein the characteristic comprises a transfer function of the transducer, and wherein the drive circuitry comprises signal generator circuitry operative to generate a signal and adaptive filter circuitry operative to filter the signal to generate the drive waveform, wherein the circuitry is configured to adapt a transfer function of the adaptive filter circuitry such that the frequency content of the drive waveform corresponds to the transfer function of the transducer.

8. Circuitry according to claim 7, wherein the circuitry further comprises receive filter circuitry, and wherein the circuitry is operative to adapt a transfer function of the receive filter circuitry to correspond to the frequency content of the drive waveform.

9. Circuitry according to claim 1, wherein the drive circuitry comprises signal generator circuitry operative to generate a signal and adaptive filter circuitry operative to filter the signal to generate the drive waveform, wherein the circuitry is configured to adapt a transfer function of the adaptive filter circuitry to minimize a transient response of the transducer to the drive waveform.

10. Circuitry according to claim 1, wherein the circuitry is further configured to provide a braking waveform, wherein the circuitry is configured to adjust the braking waveform based on the determined characteristic of the transducer.

11. Circuitry according to claim 1, further comprising control circuitry configured to detect damage to the transducer based on the determined impedance of the transducer.

12. Circuitry according to claim 11, wherein the control circuitry is configured to compare the determined impedance of the transducer to a predefined impedance value and to output a signal indicative of detection of damage if the determined impedance of the transducer differs from the predefined impedance value.

13. Circuitry according to claim 12, wherein the control circuitry is configured to output a first signal if a difference between the determined impedance of the transducer and the predefined impedance value is less than a threshold, and to output a second signal if the difference between the determined impedance of the transducer and the predefined impedance value is greater than a threshold.

14. Circuitry according to claim 1, wherein the current monitor circuitry comprises a resistor and/or a reactive element.

15. Circuitry according to claim 14, wherein the reactive element comprises one or more of a capacitor and an inductor.

16. Circuitry according to claim 1, wherein the drive waveform comprises a chirp or a series of chirps or a pulse or a series of pulses.

17. An integrated circuit comprising the circuitry of claim 1.

18. A system comprising the circuitry of claim 1 and a transducer.

19. A vehicle comprising the system of claim 18.

20. Circuitry comprising:
adaptive drive circuitry for driving a transducer with a drive waveform;
adaptive receive filter circuitry; and
system identification circuitry operative to determine a transfer function of the transducer and to control the adaptive drive circuitry and the adaptive receive filter circuitry based on the determined transfer function, wherein the system identification circuitry comprises adaptive filter circuitry;
wherein the adaptive drive circuitry is configured to apply an inverse of the determined transfer function to a signal used by the adaptive drive circuitry to generate the drive waveform; and
wherein the system identification circuitry is operative to control a center frequency of the adaptive receive filter circuitry to correspond to a center frequency of a drive waveform generated by the adaptive drive circuitry for driving the transducer.

* * * * *